(12) United States Patent
Lee et al.

(10) Patent No.: US 7,547,849 B2
(45) Date of Patent: Jun. 16, 2009

(54) COMPOSITIONS USEFUL IN ELECTRONIC CIRCUITRY TYPE APPLICATIONS, PATTERNABLE USING AMPLIFIED LIGHT, AND METHODS AND COMPOSITIONS RELATING THERETO

(75) Inventors: Yueh-Ling Lee, Princeton Junction, NJ (US); Meredith L. Dunbar, Canal Winchester, OH (US); Harry Richard Zwicker, Glen Mills, PA (US); Carl B. Wang, Raleigh, NC (US); Brian C. Auman, Pickerington, OH (US); Shane Fang, Newark, DE (US)

(73) Assignee: E.I. Du Pont de Nemours and Company, Wilmington, DE (US)

( * ) Notice: Subject to any disclaimer, the term of this patent is extended or adjusted under 35 U.S.C. 154(b) by 34 days.

(21) Appl. No.: 11/153,206

(22) Filed: Jun. 15, 2005

(65) Prior Publication Data
US 2006/0286365 A1    Dec. 21, 2006

(51) Int. Cl.
*H05K 1/00* (2006.01)
*B32B 3/00* (2006.01)
(52) U.S. Cl. .................. 174/258; 428/209; 361/750
(58) Field of Classification Search ............... 428/209; 174/258; 361/750
See application file for complete search history.

(56) References Cited

U.S. PATENT DOCUMENTS

| | | | |
|---|---|---|---|
| 2,833,686 A | 5/1958 | Sandt |
| 2,946,763 A | 7/1960 | Bro et al. |
| 3,056,881 A | 10/1962 | Schwarz et al. |
| 3,991,013 A | 11/1976 | Pletcher |
| 3,991,014 A | 11/1976 | Kleinschuster |
| 4,011,199 A | 3/1977 | McFarlane et al. |
| 4,048,148 A | 9/1977 | Morgan |
| 4,075,262 A | 2/1978 | Schaefgen |
| 4,083,829 A | 4/1978 | Calundann et al. |
| 4,118,372 A | 10/1978 | Schaefgen |
| 4,122,070 A | 10/1978 | Morgan |
| 4,130,545 A | 12/1978 | Calundann |
| 4,153,779 A | 5/1979 | Jackson et al. |
| 4,159,365 A | 6/1979 | Payet |
| 4,159,414 A | 6/1979 | Suh et al. |
| 4,161,470 A | 7/1979 | Calundann |
| 4,169,933 A | 10/1979 | Jackson et al. |
| 4,181,538 A | 1/1980 | Narayan et al. |
| 4,184,996 A | 1/1980 | Calundann |
| 4,189,549 A | 2/1980 | Matsunaga et al. |
| 4,218,494 A | 8/1980 | Belmondo et al. |
| 4,219,461 A | 8/1980 | Calundann |
| 4,232,143 A | 11/1980 | Irwin |
| 4,232,144 A | 11/1980 | Irwin |
| 4,238,600 A | 12/1980 | Jackson et al. |
| 4,242,496 A | 12/1980 | Jackson et al. |
| 4,245,082 A | 1/1981 | Irwin |
| 4,256,624 A | 3/1981 | Calundann |
| 4,269,965 A | 5/1981 | Irwin |
| 4,272,625 A | 6/1981 | McIntyre et al. |
| 4,286,250 A | 8/1981 | Sacchetti |
| 4,338,506 A | 7/1982 | Geller et al. |
| 4,370,466 A | 1/1983 | Siemionko |
| 4,383,105 A | 5/1983 | Irwin |
| 4,447,592 A | 5/1984 | Harris, Jr. |
| 4,489,230 A | 12/1984 | Yamamoto |
| 4,522,974 A | 6/1985 | Calundann et al. |
| 4,617,369 A | 10/1986 | Huynh-Ba |
| 4,664,972 A | 5/1987 | Connolly |
| 4,684,712 A | 8/1987 | Ueno et al. |
| 4,694,138 A | 9/1987 | Oodaira et al. |
| 4,727,129 A | 2/1988 | Hisgen et al. |
| 4,727,131 A | 2/1988 | Kock et al. |
| 4,728,714 A | 3/1988 | Hisgen et al. |
| 4,749,769 A | 6/1988 | Kock et al. |
| 4,762,907 A | 8/1988 | Kock |
| 4,778,927 A | 10/1988 | Kock |
| 4,816,555 A | 3/1989 | Hisgen et al. |
| 4,849,499 A | 7/1989 | Fagerburg et al. |
| 4,851,496 A | 7/1989 | Poll et al. |
| 4,851,497 A | 7/1989 | Wakui et al. |
| 4,857,626 A | 8/1989 | Kishiro et al. |
| 4,864,013 A | 9/1989 | Kageyama et al. |
| 4,868,278 A | 9/1989 | MacDonald |
| 4,882,410 A | 11/1989 | Neugebauer et al. |
| 4,923,947 A | 5/1990 | Coassolo et al. |
| 4,999,416 A | 3/1991 | Kaminade et al. |
| 5,015,721 A | 5/1991 | Gabrielli et al. |
| 5,015,722 A | 5/1991 | Charbonneau et al. |
| 5,025,082 A | 6/1991 | Kishiro et al. |
| 5,086,158 A | 2/1992 | Hayashi et al. |
| 5,102,935 A | 4/1992 | Heinz et al. |
| 5,110,896 A | 5/1992 | Waggoner et al. |

(Continued)

FOREIGN PATENT DOCUMENTS

EP    0 356 226 B1    11/2000

(Continued)

OTHER PUBLICATIONS

Database WPI Week 199414, Thomson Scientific, London, GB; AN 1994-114843, XP002488369—& JP 06 064090 A (Hitachi Chem Co Ltd), Mar. 8, 1994, Abstract Paragraph [0012].

(Continued)

*Primary Examiner*—Cathy Lam

(57) ABSTRACT

A light-activatable polymer composition and polymer composite includes a polymer binder selected from epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, the polymer binder being present in an amount from 40, 45, 50, 55, 60, 65, 70, 75, 80, 85, 90, 95, 96, or 97 weight-percent of the total weight of the polymer composition; a spinel crystal filler present in an amount from 3, 4, 5, 6, 7, 8, 9, 10, 11, 12, 13, 14, 15, 20, 25, 30, 35, 40, 45, 50, 55 and 60 weight-percent of the total weight of the polymer composition, and methods for making same are provided.

32 Claims, No Drawings

U.S. PATENT DOCUMENTS

| | | | |
|---|---|---|---|
| 5,143,956 A | 9/1992 | Pielartzik et al. | |
| 5,162,977 A * | 11/1992 | Paurus et al. | 361/762 |
| 5,721,150 A | 2/1998 | Pasch | |
| 5,883,000 A | 3/1999 | Pasch | |
| 6,150,456 A * | 11/2000 | Lee et al. | 524/606 |
| 6,159,611 A * | 12/2000 | Lee et al. | 428/473.5 |
| 6,319,564 B1 | 11/2001 | Naundorf et al. | |
| 6,657,849 B1 | 12/2003 | Andresakis et al. | |
| 7,060,421 B2 * | 6/2006 | Naundorf et al. | 430/324 |
| 7,083,848 B2 | 8/2006 | Kliesch et al. | |
| 7,112,365 B2 * | 9/2006 | Kliesch et al. | 428/331 |
| 7,504,150 B2 | 3/2009 | Lee et al. | |
| 2002/0046996 A1 | 4/2002 | Reil et al. | |
| 2002/0076497 A1 | 6/2002 | Chen et al. | |
| 2002/0110674 A1 | 8/2002 | Reil et al. | |
| 2005/0064711 A1 | 3/2005 | Kliesch et al. | |
| 2006/0083939 A1 * | 4/2006 | Dunbar et al. | 428/473.5 |
| 2006/0286364 A1 * | 12/2006 | Lee et al. | 428/323 |
| 2008/0015320 A1 * | 1/2008 | Lee et al. | 526/261 |
| 2009/0017309 A1 * | 1/2009 | Lee et al. | 428/418 |

FOREIGN PATENT DOCUMENTS

| | | |
|---|---|---|
| EP | 1 367 872 A2 | 12/2003 |
| EP | 1531657 A | 5/2005 |
| EP | 1 559 740 A1 | 8/2005 |
| EP | 1 650 249 A1 | 4/2006 |
| EP | 1734071 A | 12/2006 |
| GB | 2 072 212 A | 9/1981 |
| JP | 58-12392 A1 | 1/1983 |

OTHER PUBLICATIONS

U.S. Appl. No. 12/169,212, filed Jul. 8, 2008, Yueh-Ling Lee et al.

* cited by examiner

COMPOSITIONS USEFUL IN ELECTRONIC CIRCUITRY TYPE APPLICATIONS, PATTERNABLE USING AMPLIFIED LIGHT, AND METHODS AND COMPOSITIONS RELATING THERETO

FIELD OF INVENTION

The present invention relates generally to polymer compositions that can be activated (e.g., induced to have a much greater reactivity favorable to metallization, relative to (such reactivity, if any) prior to activation, using amplified light, such as, by means of a laser. More specifically, the compositions of the present invention comprise one or more polymeric continuous domains in combination with a plurality of discontinuous domains, the discontinuous domains comprising a type of spinel crystalline material.

BACKGROUND INFORMATION

Electronic circuits may be made from rigid epoxy-metal laminates, using a subtractive process. In such a process, a dielectric is first layered (or laminated) with a solid metal layer, and thereafter, the metal layer is converted to a metal circuit pattern by subtracting away most of the metal. This can result in a fine line conductive circuit pattern. Typically, the metal is removed by chemical etching. However, such processes can be expensive, environmentally unfriendly, and increasingly problematic in meeting performance requirements of the industry.

EP 1 367 872 A2 to Goosey et al. is directed to laser activated dielectric material and an electroless metal deposition process, involving a sensitizing pre-dip and a milling process. The process incorporates titanium dioxide, aluminum nitride or zirconium dioxide filler into a dielectric coating material, and then ultimately converting the filler (using laser energy) into a metallization catalyst.

There remains a need for alternative materials, and processes, for making light-activatable polymer compositions and polymer composites.

SUMMARY OF THE INVENTION

The present invention is directed to a light-activatable polymeric composition comprising a polymeric type binder and a spinel crystal type filler. The polymer binder comprises at least one or more of the following types of polymer (including copolymers thereof): epoxies, bismaleimides, bismaleimide triazines, fluoropolymers, polyesters, polyphenylenes oxide/polyphenylene ethers, polybutadiene/polyisoprene crosslinkable resins, liquid crystal polymers, polyamides and cyanate esters.

Depending upon the particular embodiment chosen, the polymer binder is present in an amount within a range between and including any two of the following: 40, 45, 50, 55, 60, 65, 70, 75, 80, 85, 90, 95, 96, and 97 weight-percent, based upon the total weight of the light activatable polymeric composition. The light activatable polymer composition further comprises a spinel crystal filler. Depending upon the particular embodiment chosen, the spinel crystal filler is present in an amount within a range between and including any two of the following: 3, 4, 5, 6, 7, 8, 9, 10, 11, 12, 13, 14, 15, 20, 25, 30, 35, 40, 45, 50, 55 and 60 weight-percent of the total weight of the light activateable polymeric composition. Other optional ingredients can also be incorporated into the compositions of the present invention, such as, fillers, pigments, viscosity modifiers, and other additives common to the above described polymer systems, provided however that (depending upon the particular embodiment chosen) the total amount of optional ingredients does not exceed 3, 4, 5, 6, 7, 8, 9, 10, 11, 12, 13, 14, 15, 20, 25, 30, 35, 40, 45, 50, 55 or 60 weight-percent of the total weight of the light activateable polymer composition Other features and advantages of the invention will be apparent from the following detailed description as well as the claims. The foregoing general description and the following detailed description are exemplary and explanatory only, and are not intended to be restrictive of the invention as defined in the appended claims.

DETAILED DESCRIPTION OF THE PREFERRED EMBODIMENT

Definitions:

As used herein, the terms "comprises," "comprising," "includes," "including," "has," "having" or any other variation thereof, are intended to cover a non-exclusive inclusion. For example, a composition, a film, a composite, process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Also, use of the "a" or "an" are employed to describe elements and components of the invention. This is done merely for convenience and to give a general sense of the invention. This description should be read to include one or at least one and the singular also includes the plural unless it is obvious that it is meant otherwise.

As used herein, the term "film" or "polymer film" describes the physical form of the polymer composition, which may be flexible or rigid, and in roll or sheet form.

As used herein, the term "composition" or "polymer composition" describes a composition including various components, for example, spinel crystal filler(s) and polymer binder(s).

As used herein, the term "composite" describes a layered structure having at least one or more layers.

As used herein, the term "prepreg" means a woven glass or fiber-reinforced rigid dielectric layer with a partially cured B-stage polymer composition or a fully cured C-stage polymer composition. For example, a composition according to an aspect of the invention is impregnated into a woven glass structure to form a prepreg.

As used herein the terms FR4 and FR-5 are chemically specific epoxy resins in a glass reinforced matrix, for example, copper clad epoxy impregnated glass fabric board in various grades classified by National Electrical Manufacturers Association (NEMA) which include FR4 and FR-5.

As used herein the term "adjacent" does not necessarily mean that a layer, member or structure is immediately next to another layer, member or structure. A combination of layer(s), member(s) or structure(s) that directly contact each other are still adjacent to each other.

As used herein, the term "DC" means digital circuitry.

As used herein, the term "functional layer" means a layer that has functional characteristics including, but not limited to: thermally conductive, dimensionally stable, adhesive, capacitive, resistive, and high frequency dielectric capability.

Unless otherwise defined, all technical and scientific terms used herein have the same meaning as commonly understood by one of ordinary skill in the art to which this invention belongs. Although methods and materials similar or equivalent to those described herein can be used in the practice or testing of the invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Descriptions:

In one embodiment, the light-activatable polymer composition of the present invention includes a polymer binder selected from epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, and a spinel crystal filler. The polymer binder is present in an amount from 40, 45, 50, 55, 60, 65, 70, 75, 80, 85, 90, 95, 96 or 97 weight-percent of the total weight of the polymer composition. The spinel crystal filler is present in an amount from 3, 4, 5, 6, 7, 8, 9, 10, 11, 12, 13, 14, 15, 20, 25, 30, 35, 40, 45, 50, 55 and 60 weight-percent of the total weight of the polymer composition.

In another embodiment, a single-layer light-activatable polymer composite, includes a polymer composition comprising at least 40, 45, 50, 55, 60, 65, 70, 75, 80, 85, 90, 95, 96 or 97 weight-percent of a polymer binder selected from the group consisting of epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, and a spinel crystal filler. The weight percent of the spinel crystal filler, based on the total weight of the polymer composition used in the layer; is at least 3, 4, 5, 6, 7, 8, 9, 10, 11, 12, 13, 14, 15, 20, 25, 30, 35, 40, 45, 50, 55 or 60 weight-percent.

In another embodiment, a two-layer light-activatable polymer composite includes a first layer and a second layer; the first layer including a composition that includes at least 40, 45, 50, 55, 60, 65, 70, 75, 80, 85, 90, 95, 96 or 97 weight-percent of a polymer selected from epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, the weight percent of the polymer binder based on the total weight of the polymer composition used in the first layer; and, at least 3, 4, 5, 6, 7, 8, 9, 10, 11, 12, 13, 14, 15, 20, 25, 30, 35, 40, 45, 50, 55 or 60 weight-percent spinel crystal filler based on the total weight of the polymer composition used in the first layer, and the second layer includes a functional layer.

In another embodiment, a three-layer light-activatable polymer composite includes two outer layers adjacent to an inner layer; the inner layer is positioned between the two outer layers, wherein at least one of the outer layers includes a polymer composition that includes at least 40, 45, 50, 55, 60, 65, 70, 75, 80, 85, 90, 95, 96 or 97 weight-percent of a polymer binder selected from epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, the weight percent of the polymer binder based on the total weight of the polymer composition used in the one outer layer; and, at least 3, 4, 5, 6, 7, 8, 9, 10, 11, 12, 13, 14, 15, 20, 25, 30, 35, 40, 45, 50, 55 or 60 weight-percent spinel crystal filler based on the total weight of the polymer composition used in the one outer layer, and the inner layer (and optionally the other outer layer) is a functional layer.

In another embodiment, a process for making a light-activatable polymer composition includes the steps of: dispersing a spinel crystal filler in an organic solvent to form a dispersion where the average particle size of the spinel crystal filler is between (and includes) any two of the following numbers 50, 100, 300, 500, 800, 1000, 2000, 3000, 4000, 5000 and 10000 nanometers; combining the dispersion with a polymer binder selected from epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, to form a polymer composition; applying the polymer composition onto a portion of a flat surface to form a layer, and applying thermal energy to the layer to form a polymer composite.

In another embodiment, a process in accordance with the present invention further includes light-activating a portion of the polymer composite with a laser beam to form a light activated pattern on a surface of the composite, and metal plating the light activated pattern of the polymer composite using an electroless (or conceivably an electrolytic) plating bath to form electrically conductive pathways on the light activated pattern. In one embodiment, a light-activatable polymer composition includes a polymer binder selected from a group consisting of: epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, the polymer binder being present in an amount from 40, 45, 50, 55, 60, 65, 70, 75, 80, 85, 90, 95, 96 or 97 weight-percent of the total weight of the polymer composition; and a spinel crystal filler present in an amount from 3, 4, 5, 6, 7, 8, 9, 10, 11, 12, 13, 14, 15, 20, 25, 30, 35, 40, 45, 50, 55 and 60 weight-percent of the total weight of the polymer composition. The polymer composition has a visible-to-infrared light extinction coefficient between and including any two of the following numbers 0.05, 0.06, 0.07, 0.08, 0.09, 0.1, 0.2, 0.3, 0.4, 0.5, and 0.6 per micron. The spinel crystal filler is represented by the chemical formula $AB_2O_4$ or $BABO_4$. The A component of the formulas is a metal cation having a valence of 2 and is selected from the group consisting of cadmium, zinc, copper, cobalt, magnesium, tin, titanium, iron, aluminum, nickel, manganese, chromium, and combinations of two or more of these. The B component of the formulas is a metal cation having a valence of 3 and is selected from the group consisting of cadmium, manganese, nickel, zinc, copper, cobalt, magnesium, tin, titanium, iron, aluminum, chromium, and combinations of two or more of these.

Alternatively, the A component is an element from the periodic table selected from the group consisting of cadmium, chromium, manganese, nickel, zinc, copper, cobalt, iron, magnesium, tin, titanium, and combinations of two or more of these, and the B component is an element from the periodic table selected from the group consisting of chromium, iron, aluminum, nickel, manganese, tin, and combinations of two or more of these.

The spinel crystal filler can have an average particle size between and including any two of the following numbers 50, 100, 300, 500, 800, 1000, 2000, 3000, 4000, 5000 and 10000 nanometers.

The composition may be impregnated into a glass structure to form a prepreg, may be impregnated into a fiber structure, or may be in the form of a film.

The film composites of the present invention may have a thickness between and including any two of the following numbers 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns.

In another embodiment, a single-layer light-activatable polymer composite includes a polymer composition comprising at least 40, 45, 50, 55, 60, 65, 70, 75, 80, 85, 90, 95, 96, or 97 weight-percent of a polymer binder selected from the group consisting of epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, the weight percent of the polymer binder based on the total weight of the polymer composition used in the first layer; and, at least 3, 4, 5, 6, 7, 8, 9, 10, 11, 12, 13, 14, 15, 20, 25, 30, 35, 40, 45, 50, 55 or 60 weight-percent spinel crystal filler based on the total weight of the polymer composition. The single layer polymer composite can have a visible-to-infrared light extinction coefficient between and including any two of the following numbers 0.05, 0.06, 0.07, 0.08, 0.09, 0.1, 0.2, 0.3, 0.4, 0.5, and 0.6 per micron. The single layer polymer composite includes a polymer binder, which can be an epoxy resin, bismaleimide resin, bismaleimide triazine, a fluoropolymer, polyester, a liquid crystal polymer, a polyamide, or a cyanate ester.

In another embodiment, a two-layer light activatable polymer composite includes a first layer and a second layer; the first layer comprising a composition comprising at least 40, 45, 50, 55, 60, 65, 70, 75, 80, 85, 90, 95, 96 or 97 weight-percent of a polymer binder selected from the group consisting of epoxy resins, silica filled epoxy, bismaleimide resins, bismaleimide triazines, fluoropolymers, polyesters, polyphenylene oxide/polyphenylene ether resins, polybutadiene/ polyisoprene crosslinkable resins (and copolymers), liquid crystal polymers, polyamides, cyanate esters, or combinations thereof, the weight percent of the polymer binder based on the total weight of the polymer composition used in the first layer; and, at least 3, 4, 5, 6, 7, 8, 9, 10, 11, 12, 13, 14, 15, 20, 25, 30, 35, 40, 45, 50, 55 or 60 weight-percent spinel crystal filler based on the total weight of the polymer composition used in the first layer, and the second layer comprises a functional layer. The first layer may be in the form of a film or a prepreg. The first layer can have a visible-to-infrared light extinction coefficient between and including any two of the following numbers 0.05, 0.06, 0.07, 0.08, 0.09, 0.1, 0.2, 0.3, 0.4, 0.5, and 0.6 per micron. The second functional layer may be in the form of a film or prepreg. The second functional layer may also be a thermal conduction layer, a capacitor layer, a resistor layer, a dimensionally stable dielectric layer, or an adhesive layer.

In another embodiment, a three-layer light-activatable polymer composite includes two outer layers adjacent to an inner layer; the inner layer positioned between the two outer layers, wherein at least one of the outer layers comprises a polymer composition comprising at least 40, 45, 50, 55, 60, 65, 70, 75, 80, 85, 90, 95, 96 or 97 weight-percent of a polymer binder selected from the group consisting of epoxy resins, silica filled epoxy, bismaleimide resins, bismaleimide triazines, fluoropolymers, polyesters, polyphenylene oxide/ polyphenylene ether resins, polybutadiene/polyisoprene crosslinkable resins (and copolymers), liquid crystal polymers, polyamides, cyanate esters, or combinations thereof, the weight percent of the polymer binder based on the total weight of the polymer composition used in the first layer; and, at least 3, 4, 5, 6, 7, 8, 9, 10, 11, 12, 13, 14, 15, 20, 25, 30, 35, 40, 45, 50, 55 or 60 weight-percent spinel crystal filler based on the total weight of the polymer composition used in the first layer, and wherein in the inner layer (and optionally one of the outer layers) comprises a functional layer like a film or prepreg.

In another embodiment, a process for making a light-activatable polymer composition comprises the steps of: dispersing a spinel crystal filler in an organic solvent to form a dispersion, wherein the average particle size of the spinel crystal filler is between any two of the following numbers 50, 100, 300, 500, 800, 1000, 2000, 3000, 4000, 5000 and 10000 nanometers; combining the dispersion with a polymer binder selected from the group consisting of epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, to form a polymer composition; applying the polymer composition onto a portion of a flat surface to form a layer; and applying thermal energy to the layer to cure the polymer composition. The thermally exposed polymer composition may have a visible-to-infrared light extinction coefficient between and including any two of the following numbers 0.05, 0.06, 0.07, 0.08, 0.09, 0.1, 0.2, 0.3, 0.4, 0.5, and 0.6 per micron. The process may further include the steps of: light-activating a portion of the polymer composition with a laser beam to form light activated pattern on a surface of the composition, and metal plating the light activated pattern of the polymer composition using an electroless (or electrolytic) plating bath to form electrically conductive pathways on the light activated portions.

In yet another embodiment, a circuit board incorporates the polymer composition. The compositions may also be incorporated into a component selected from an integrated circuit package, an interconnect in a pin grid array, a multi-chip module, a chip-scale package, a ball grid array, a radio frequency module, a digital module, chip-on-flex, a stacked via substrate, a printed circuit board having embedded passive devices, a high density interconnect circuit board, an "LGA" Land grid array, an "SOP" (System-on Package) Module, a "QFN" Quad Flat package-No Leads, and a "FC-QFN" Flip Chip Quad Flat package-No leads, a component used in a high density interconnect, including a wafer scale package, a tape automated bonding circuit package, a chip-on-flex circuit package, or a chip-on-board electronic circuit package.

The compositions of the present invention may optionally further comprise an additive selected from the group consisting of an antioxidant, a light stabilizer, a light extinction coefficient modifier, a flame retardant additive, an anti-static agent, a heat stabilizer, a reinforcing agent, an ultraviolet light absorbing agent, an adhesion promoter, an inorganic filler, for example, silica, a surfactant or dispersing agent, or combinations thereof. Light extinction coefficient modifiers include, but are not limited to, carbon powder or graphite powder.

The polymer compositions of the invention have dispersed therein highly light activatable spinel crystal fillers, where the fillers comprise two or more metal oxide cluster configurations within a definable crystal formation. The overall crystal formation, when in an ideal (i.e., non-contaminated, non-derivative) state, has the following general formula:

$$AB_2O_4$$

Where:
i. A (in one embodiment, A is a metal cation having primarily, if not exclusively, a valance of 2) is selected from a group including cadmium, chromium, manganese, nickel, zinc, copper, cobalt, iron, magnesium, tin, titanium, and combinations thereof, which provides the primary cation component of a first metal oxide cluster ("metal oxide cluster 1") typically a tetrahedral structure,
ii. B (in one embodiment, B is a metal cation having primarily, if not exclusively, a valance of 3) is selected from the group including chromium, iron, aluminum, nickel, manganese, tin, and combinations thereof and which provides the primary cation component of a second metal oxide cluster ("metal oxide cluster 2") typically an octahedral structure,
iii. where within the above groups A or B, any metal cation having a possible valence of 2 can be used as an "A", and any metal cation having a possible valence of 3 can be used as a "B",
iv. where the geometric configuration of "metal oxide cluster 1" (typically a tetrahedral structure) is different from the geometric configuration of "metal oxide cluster 2" (typically an octahedral structure),
v. where a metal cation from A and B can be used as the metal cation of "metal oxide cluster 2" (typically the octahedral structure), as in the case of an 'inverse' spinel-type crystal structure,
vi. where O is primarily, if not exclusively, oxygen; and
vii. where the "metal oxide cluster 1" and "metal oxide cluster 2" together provide a singular identifiable crystal type structure having heightened susceptibility to electromagnetic radiation evidenced by the following property, when dispersed in a polymer-based dielectric at a loading of about 10 to about 30 weight percent, a "visible-to-infrared light" extinction coefficient can be measure to be between and including any two of the following numbers, 0.05, 0.06, 0.07, 0.08, 0.09, 0.1, 0.2, 0.3, 0.4, 0.5 and 0.6 per micron.

The spinel crystal fillers can be dispersed in a polymer binder solution. The polymer binder solution includes epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof, dissolved in a solvent. The fillers are typically dispersed at a weight-percent between and including any two of the following numbers 3, 5, 7, 9, 10, 12, 15, 20, 25, 30, 35, 40, 45, 50, 55 and 60 weight-percent of the polymer, and initially have an average particle size (after incorporation into the polymer binder) of between and including any two of the following numbers 50, 100, 300, 500, 800, 1000, 2000, 3000, 4000, 5000 and 10000 nanometers.

The spinel crystal fillers can be dispersed in an organic solvent (either with or without the aid of a dispersing agent) and in a subsequent step, dispersed in a polymer binder solution to form a blended polymer composition. The blended polymer composition can then be cast onto a flat surface (or drum), heated, dried, and cured or semi-cured to form a polymer film with a spinel crystal filler dispersed therein.

The polymer film can then be processed through a light activation step by using a laser beam. The laser beam can be focused, using optical elements, and directed to a portion of the surface of the polymer film where a circuit-trace, or other electrical component, is desired to be disposed. Once selected portions of the surface are light-activated, the light-activated portions can be used as a path (or sometimes a spot) for a circuit trace to be formed later, by a metal plating step for example, an electroless plating step.

The number of processing steps employed to make a circuit using the polymer film or polymer composites are often far fewer relative to the number of steps in the subtractive processes presently employed in the industry today.

In one embodiment, the polymer compositions and polymer composites have a visible-to-infrared light extinction coefficient of between and including any two of the following numbers 0.05, 0.06, 0.07, 0.08, 0.09, 0.1, 0.2, 0.3, 0.4, 0.5, and 0.6 per micron (or 1/micron). Visible-to-infrared light is used to measure a light extinction coefficient for each film. The thickness of the film is used in the calculations for determining the light extinction coefficient.

As used herein, the visible-to-infrared light extinction coefficient (sometimes referred to herein to simply as 'alpha') is a calculated number. This calculated number is found by taking the ratio of measured intensity of a specific wavelength of light (using a spectrometer) after placing a sample of the composite film in a light beam path, and dividing that number by the light intensity of the same light through air.

If one takes the natural log of this ratio and multiplies it by (−1), then divides that number by the thickness of the film (measured in microns), a visible-to-infrared light extinction coefficient can be calculated.

The general equation for the visible-to-infrared light extinction coefficient is then represented by the general formula:

$$\text{Alpha} = -1 \times [\ln(I(X)/I(O))]/t$$

where I(X) represents the intensity of light transmitted through a film,
where I(O) represents the intensity of light transmitted through air, and
where t represents the thickness of a film.

Typically, the film thickness in these calculations is expressed in microns. Thus, the light extinction coefficient (or alpha number) for a particular film is expressed as 1/microns, or inverse microns (e.g., microns$^{-1}$). Particular wavelengths of light useful in the measurements discussed herein are typically those wavelengths of light covering the visible-to-infrared light portion of the spectrum.

The polymer compositions and polymer composites comprise spinel crystal fillers, substantially homogeneously dispersed, in a polymer binder solution in an amount within a range between (and including) any two of the following weight-percentages 3, 4, 5, 6, 7, 8, 9, 10, 12, 15, 18, 20, 24, 25, 28, 30, 32, 34, 35, 36, 38, 40, 42, 44, 46, 48, 50, 52, 54, 56, 58 and 60 weight-percent. Polymer composites containing too much spinel crystal filler can sometimes be too brittle to handle in downstream processing as the composites tend to lose flexibility with higher loadings of filler.

In one embodiment, the spinel crystal fillers are represented by the general formula:

$$AB_2O_4$$

where A is a metal cation typically having a valence 2, and is selected from a group comprising cadmium, chromium, manganese, nickel, zinc, copper, cobalt, iron, magnesium, tin, titanium, and combinations of two or more of these, and where B is a metal cation typically having a valence of 3, and is selected from the group comprising chromium, iron, aluminum, nickel, manganese, tin, and combinations of two or more of these, and where O is primarily, if not in all cases, oxygen.

In one embodiment, the metal cation A provides the primary cation component of a first metal oxide cluster, "metal oxide cluster 1" (typically a tetrahedral structure) of a spinel structure. Metal cation B provides the primary cation component of a second metal oxide cluster, "metal oxide cluster 2" (typically an octahedral structure).

In another embodiment, within the above groups A and B, any metal cation having a possible valence of 2 can be used as an "A" cation. In addition, any metal cation having a possible valence of 3 can be used as a "B" cation provided that the geometric configuration of "metal oxide cluster 1" is different from the geometric configuration of "metal oxide cluster 2".

In yet another embodiment, A and B can be used as the metal cation of "metal oxide cluster 2" (typically the octahedral structure). This is true in the particular case of an 'inverse' spinel-type crystal structure typically having the general formula $B(AB)O_4$.

In one or more steps, a polymer binder is solvated to a sufficiently low viscosity (typically, a viscosity of less than 50, 40, 30, 20, 15, 10, 9, 8, 7, 6, 5, 4, 3, 2, 1.5, 1, 0.5, 0.1, 0.05, and 0.001 kilopoise) to allow the spinel crystal filler (which can also be suspendable in a similar or the same solvent) to be adequately dispersed within the polymer binder solution. The dispersion of the spinel crystal filler is conducted in such a manner as to avoid undue agglomeration of the particles in the solution or the dispersion. Unwanted agglomeration of the filler particles can cause unwanted interfacial voids, or other problems in the polymer composite.

The spinel crystal filler particles can be dispersed in the polymer binder solution directly, or can be dispersed in a solvent prior to dispersion in the polymer binder solution. The filler particles can be mixed in a solvent to form a dispersion, until the particles have reached an average particle size of between any two of the following numbers 50, 100, 300, 500, 800, 1000, 2000, 3000, 4000, 5000, and 10000 nanometers. The dispersion may then be mixed using a high-speed, or high-shear, mixing apparatus. Spinel crystal filler may be dispersed using various suitable solvents. In some cases, the dispersions may also include one or more suitable dispersing agents known to a skilled artisan for assistance in forming a stable dispersion, particularly for commercial scale production.

The spinel crystal fillers dispersed in the polymer binder solution generally have an average particle size between and including any two of the following numbers 50, 100, 200, 250, 300, 350, 400, 450, 500, 1000, 2000, 3000, 4000, 5000 and 10000 nanometers. Generally, at least 80, 85, 90, 92, 94, 95, 96, 98, 99 or 100 percent of the dispersed spinel crystal filler is within the above size range(s). Crystal size, in the polymer binder solution, can be determined by a laser particle analyzer, such as an LS130 particle size analyzer with small volume module made by COULTER®.

The polymer binder solution and the spinel crystal filler particles are combined to form a relatively uniform dispersion of the composition. The composition may then be converted as described below into a polymer composite where the solids content is typically greater than 98.0, 98.5, 99.0 or 99.5 weight-percent.

Because some spinel crystal fillers are easily dispersed in a polymer binder solution, with little or no additional shearing force required, slurries formed can contain often fewer than 100, 50, 20, 10, 8, 6, 5, 4, 3, 2, or 1 parts per million (ppm) undesired agglomerates. Undesirable agglomerates are defined as a collection of bound (adjoining) spinel crystal fillers having an average particle size of greater than 10, 11, 12, 13, 14, or 15 microns. However, some spinel crystal fillers may require some milling or filtration to break up unwanted particle agglomeration for adequately dispersing nano-sized fillers into a polymer. Milling and filtration can be costly, and may not satisfactorily remove all unwanted agglomerates. Thus, in one embodiment, the spinel crystal filler is dispersible, and suspendable, at 20 weight-percent in a (at least 99 weight-percent pure) dimethylacetamide solvent. After dispersing and suspending the spinel crystal filler into a solvent (optionally with the aid of a high-shear mechanical mixer) less than 15, 10, 8, 6, 4, 2 or 1 weight-percent of the filler particles by weight can precipitate out of solution when the solution was kept at rest for 72 hours at 20° C.

The present invention employs the use of a selected group of spinel crystal fillers to allow for efficient and accurate surface patterning through activation by a laser (or other similar type light patterning technique) prior to bulk metallization of the pattern formed by the laser.

In one embodiment, a light extinction coefficient modifier can be added as a partial substitute for some, but not all, of the spinel crystal filler. Appropriate amounts of substitution can range from, between and including any two of the following numbers, 1, 2, 3, 4, 5, 10, 15, 20, 25, 30, 35, or 40 weight percent of the total amount of spinel crystal filler component. In one embodiment, about 10 weight percent of the spinel crystal filler can be substituted with a carbon powder or graphite powder. The polymer composite formed therefrom should have a sufficient amount of spinel crystal structure present in the polymer composite to allow metal ions to plate effectively on the surface thereof, while the above mentioned amount of substitute (e.g., carbon powder) darkens the polymer composite sufficiently enough so that the a sufficient amount of light energy (i.e., an amount of light energy that effectively light activates the surface of the composite) can be absorbed.

A specific range of useful light extinction coefficients has been advantageously found for the polymer compositions and polymer composites. Specifically, it was found that the polymer compositions and polymer composites require a sufficient degree of light-absorption capability to work effectively in high-speed light activation steps typically employing the use of certain laser machines.

For example, in one type of light-activation step employed (e.g., a step employing the use of a laser beam) it was found that the polymer compositions and composites of the present invention are capable of absorbing a significant amount of light energy so that a well-defined circuit trace pattern can be formed thereon. This can be done in a relatively short time. Conversely, commercially available polymer films (i.e., films without these particular fillers, or films containing non-functional spinel crystal fillers) may take longer, have too low a light extinction coefficient, and may not be capable of light-activating in a relatively short period, if at all. Thus, many polymer films, even films containing relatively high loadings of other types of spinel crystal fillers, may be incapable of absorbing enough light energy to be useful in high-speed, light activation manufacturing, as well as being able to receive plating of a metal in well-defined circuit patterns.

A wide range of polymer binders suitable for use in the embodiments of the invention include epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, or combinations thereof. The polymer binders may include an inorganic filler, for example, silica or alumina. A wide range of polymer binders was found to be particularly useful in the preparation of the polymer compositions and composites.

Useful organic solvents for the preparation of the polymer binders of the invention should be capable of dissolving the polymer binders. A suitable solvent should also have a suitable boiling point, for example, below 225° C., so the polymer solution can be dried at moderate (i.e., more convenient and less costly) temperatures. A boiling point of less than 210, 205, 200, 195, 190, 180, 170, 160, 150, 140, 130, 120 and 110° C. is suitable.

As described above, suitable polymer binders for use in the embodiments of the invention include epoxy resins, silica filled epoxy, bismaleimide triazine (BT), fluoropolymers, polyesters, polyphenylene oxide/polyphenylene ether resins, polybutadiene/polyisoprene crosslinkable resins (and copolymers), liquid crystal polymers, polyamides, and cyanate esters.

Epoxy resins are thermoplastic materials which can be cured to a thermoset polymer. Major resin types include diglycidyl ethers of bisphenol A, novolacs, peracid resins, and hydantoin resins, among others. There are many epoxy resin suppliers in the world and the most recognizable trade names include Araldite, DER, Epi-Cure, Epi-Res, Epikote, Epon, Epotuf, each of which provide a wide range of properties depending on the formulation and processing. Additional components may also be added to an epoxy resin and curing agent formulation. These components include, but are not limited to, diluents, resinous modifiers to affect flexibility, toughness or peel strength, adhesion fillers, colorants, dyes, rheological additives, and flame retardants.

In one embodiment, the polymer binder may include an epoxy resin. Examples of suitable epoxy resins, include, but are not limited to, glycidyl ether type epoxy resin, glycidyl ester resin and glycidylamine type epoxy resin. In addition, any silica or alumina-filled epoxies are also suitable.

Examples of suitable glycidyl ether type epoxy resins include, but are not limited to: bisphenol A type, bisphenol F type, brominated bisphenol A type, hydrogenated bisphenol A type, bisphenol S type, bisphenol AF type, biphenyl type, naphthalene type, fluorene type, phenol novolac type, cresol novolac type, DPP novolac type, trifunctional type, tris(hydroxyphenyl)methane type, and tetraphenylolethane type epoxy resins.

Examples of suitable glycidyl ester type epoxy resins include, but are not limited to: hexahydrophthalate type and phthalate type epoxy resins.

Examples of suitable glycidylamine type epoxy resins include, but are not limited to: tetraglycidyldiaminodiphenylmethane, triglycidyl isocyanurate, hydantoin type, 1,3-bis(N, N-diglycidylaminomethyl)cyclohexane, aminophenol type, aniline type, and toluidine type epoxy resins.

In one embodiment, the polymer binder may include a polyester. Examples of suitable polyesters include, but are not limited to: polyethylene terephthalate, polybutylene terephthalate, poly(trimethylene)terephthalate, etc., poly(e-caprolactone), polycarbonate, poly(ethylene-2,6-naphthalate), poly(glycolic acid), poly(4-hydroxy benzoic acid)-co-poly(ethyleneterephthalate) (PHBA), and poly(hydroxybutyrate).

In another embodiment, the polymer binder may include a polyamide. Examples of suitable aliphatic polyamides include, but are not limited to: nylon 6, nylon 6,6, nylon 6,10 and nylon 6,12, nylon 3, nylon 4,6 and copolymers thereof are useful with this invention. Examples of aliphatic aromatic polyamides include, but are not limited to, nylon 6T (or nylon 6(3)T), nylon 10T and copolymers thereof, nylon 11, nylon 12 and nylon MXD6 are also suitable for use with this invention. Examples of aromatic polyamides include, but are not limited to, poly(p-phenylene terephthalamide), poly(p-benzamide), and poly(m-phenylene isophthalamide) are also suitable for use with this invention.

In another embodiment, the polymer binder may include a fluoropolymer. The term fluoropolymer is intended to mean any polymer having at least one, if not more, fluorine atoms contained within the repeating unit of the polymer structure. The term fluoropolymer, or fluoropolymer component, is also intended to mean a fluoropolymer resin (i.e. a fluoro-resin). Commonly, fluoropolymers are polymeric material containing fluorine atoms covalently bonded to, or with, the repeating molecule of the polymer. Suitable fluoropolymer components include, but are not limited to:

1. "PFA", a poly(tetrafluoroethylene-co-perfluoro[alkyl vinyl ether]), including variations or derivatives thereof, having the following moiety representing at least 50, 60, 70, 80, 85, 90, 95, 96, 97, 98, 99 or about 100 weight percent of the entire polymer:

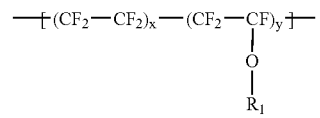

where $R_1$ is $C_nF_{2n+1}$, where n can be any natural number equal to or greater than 1 including up to 20 or more, typically n is equal to 1 to three, where x and y are mole fractions, where x is in a range from 0.95 to 0.99, typically 0.97, and where y is in a range from 0.01 to 0.05, typically 0.03, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

2. "FEP", a poly(tetrafluoroethylene-co-hexafluoropropylene) [a.k.a. poly(tetrafluoroethylene-co-hexafluoropropylene) copolymer], derived in whole or in part from tetrafluoroethylene and hexafluoropropylene, including variations or derivatives thereof, having the following moiety representing at least 50, 60, 70, 80, 85, 90, 95, 96, 97, 98, 99 or about 100 weight percent of the entire polymer:

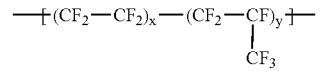

where x and y are mole fractions, where x is in a range from 0.85 to 0.95, typically 0.92, and where y is in a range from 0.05 to 0.15, typically 0.08, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.). The FEP copolymer can be derived directly or indirectly from: (i.) 50, 55, 60, 65, 70 or 75 percent to about 75, 80, 85, 90 or 95 percent tetrafluoroethylene; and (ii.) 5, 10, 15, 20, or 25 percent to about 25, 30, 35, 40, 45 or 50 percent (generally 7 to 27 percent) hexafluoropropylene. Such FEP copolymers are well known and are described in U.S. Pat. Nos. 2,833,686 and 2,946,763.

3. "PTFE", a polytetrafluoroethylene, including variations or derivatives thereof, derived in whole or in part from tetrafluoroethylene and having the following moiety representing at least 50, 60, 70, 80, 85, 90, 95, 96, 97, 98, 99 or about 100 weight percent of the entire polymer: where x is equal to any natural number between 50 and 500,000.

4. "ETFE", a poly(ethylene-co-tetrafluoroethylene), including variations or derivatives thereof, derived in whole or in part from ethylene and tetrafluoroethylene and having the following moiety representing at least 50, 60, 70, 80, 85, 90, 95, 96, 97, 98, 99, or about 100 weight percent of the entire polymer:

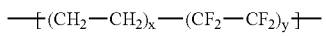

where x and y are mole fractions, where x is in a range from 0.40 to 0.60, typically 0.50, and where y is in a range from 0.40 to 0.60, typically 0.50, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

Advantageous characteristics of fluoropolymer resins include high-temperature stability, resistance to chemical attack, advantageous electrical properties (high-frequency properties in particular) low friction properties, and low tackiness. Other potentially useful fluoropolymer resins include the following:

1. chlorotrifluoroethylene polymer (CTFE);
2. tetrafluoroethylene chlorotrifluoroethylene copolymer (TFE/CTFE);
3. ethylene chlorotrifluoroethylene copolymer (ECTFE);
4. polyvinylidene fluoride (PVDF);
5. polyvinylfluoride (PVF); and
6. Teflon® AF (sold by E.I. du Pont de Nemours & Co.).

In yet another embodiment, the polymer binder may include a liquid crystal polymer or thermotropic liquid crystal polymer. Liquid crystal polymers generally include a fusible or melt processible polyamide or polyester. Liquid crystal polymers also include, but are not limited to, polyesteramides, polyesterimides, and polyazomethines. Suitable liquid crystal polymers are described by Jackson et al. in U.S. Pat. Nos. 4,169,933, 4,242,496 and 4,238,600, as well as in "Liquid Crystal Polymers VI: Liquid Crystalline Polyesters of Substituted Hydroquinones." The term "thermotropic" means a polymer that when tested by the TOT test as described in U.S. Pat. No. 4,075,262 transmits light through crossed polarizers and is thus considered to form an anisotropic melt. Suitable liquid crystal polymers are described, for example in U.S. Pat. Nos. 3,991,013; 3,991,014; 4,011,199; 4,048,148; 4,075,262; 4,083,829; 4,118,372; 4,122,070; 4,130,545; 4,153,779; 4,159,365; 4,161,470; 4,169,933; 4,184,996; 4,189,549; 4,219,461; 4,232,143; 4,232,144; 4,245,082; 4,256,624; 4,269,965; 4,272,625; 4,370,466; 4,383,105; 4,447,592; 4,522,974; 4,617,369; 4,664,972; 4,684,712; 4,727,129; 4,727,131; 4,728,714; 4,749,769; 4,762,907; 4,778,927; 4,816,555; 4,849,499; 4,851,496; 4,851,497; 4,857,626; 4,864,013; 4,868,278; 4,882,410; 4,923,947; 4,999,416; 5,015,721; 5,015,722; 5,025,082; 5,1086,158; 5,102,935; 5,110,896 and U.S. Pat. No. 5,143, 956; and European Patent Application 356,226. Commercial examples of liquid crystal polymers include the aromatic polyesters or poly(ester-amides) sold under the trademarks Zenite® (DuPont), VECTRA® (Hoechst), and XYDAR® (Amoco).

In another embodiment, the polymer binders of the present invention may include a cyanate ester. An example of a suitable cyanate ester includes, but is not limited to, dicyanobisphenol A and 4,4'-isopropyl bis(phenyl cyanate). Modification of this basic structure can be used to provide various engineering properties, including but not limited to toughness, rigidity, and elevated glass transition temperature. Upon heating these monomers, prepolymers are obtained, which are typically triazine resins. Upon further heating highly crosslinked polycyanurate is formed with a glass transition temperature in the 240-290° C. range. The resins may be used by themselves or in blends with epoxy. For certain electronic applications, at least three polymers based on cyanate esters are used: a cyanate ester homopolymer, a copolymer of cyanate ester with bismaleimide (known as a bismaleimide triazine (BT) resin), and bismaleimide.

The polymer binders of the present invention, when dissolved in a suitable solvent to form a polymer binder solution (and/or casting solution), may also contain one or more additives. These additives include, but are not limited to, processing aids, antioxidants, light stabilizers, light extinction coefficient modifiers, flame retardant additives, anti-static agents, heat stabilizers, ultraviolet light absorbing agents, inorganic fillers, for example, silicon oxides, adhesion promoters, reinforcing agents, and a surfactant or dispersing agent, and combinations thereof.

The polymer solution can be cast or applied onto a support, for example, an endless belt or rotating drum, to form a film layer. The solvent-containing film layer can be converted into a self-supporting film by baking at an appropriate temperature (which may be thermal curing) or simply by drying (or partial drying known as "B-stage") which produces a substantially dry film. Substantially dry film, as used herein, is a defined as a film with less than 2, 1.5, 1.0, 0.5, 0.1, 0.05, and 0.01 weight-percent volatile (e.g., solvent or water) remaining in the polymer composite. In addition, thermoplastic polymer compositions, having the spinel crystal filler dispersed therein, can be extruded to form either a film or any other pre-determined shaped article.

In one embodiment, a polymer film (polymer composite) is made having a thickness of between, and including, any two of the following numbers 1, 2, 3, 4, 5, 7, 8, 9, 10, 12, 14, 16, 18, 20, 25, 30, 35, 40, 45, 50, 55, 60, 65, 70, 75, 80, 85, 90, 95, 100, 125, 150, 175 and 200 microns. When the spinel crystal fillers are dispersed in a polymer binder, for example, at a loading level of about 10 to about 30 weight percent, a "visible-to-infrared light" extinction coefficient is measured to be, between and including any two of the following numbers, 0.05, 0.06, 0.07, 0.08, 0.09, 0.1, 0.2, 0.3, 0.4, 0.5 and 0.6 per micron.

In the embodiments of the invention, the spinel crystal fillers described allow for good metal-ion deposition onto an already light-activated pathway (formed in a relatively short period via a laser beam). In addition, the spinel crystal fillers provide a visible-to-infrared light extinction coefficient to the composite that provides functionality in high-speed light activation process (i.e., 'light activation' is performed easily with relatively low levels of light).

In accordance with the invention, the polymer binder is chosen to provide important physical properties to the composition and polymer composite. Beneficial properties include, but are not limited to, good adhesiveness (i.e., metal adhesion or adhesion to a metal), high and/or low modulus (depending upon the application), high mechanical elongation, a low coefficient of humidity expansion (CHE), and high tensile strength.

As with the polymer binder, the spinel crystal filler can also be specifically selected to provide a polymer composite having a well-defined light-activated pathway after intense light-energy has been applied. For example, a well-defined light-activated pathway can more easily produce well-defined circuit metal traces after the light-activated material is submerged in an electroless-plating bath. Metal is typically deposited onto the light-activated portion of the surface of the polymer composite via an electroless-plating step.

In one embodiment, the polymer compositions of the invention are used to form a multi-layer (at least two or more layers) polymer composite. The multi-layer polymer composite can be used as at least a portion of a printed circuit board ("PCB"), chip scale package, wafer scale package, high density interconnect board (HDI), module, "LGA" Land grid array, "SOP" (System-on Package) Module, "QFN" Quad Flat package-No Leads, "FC-QFN" Flip Chip Quad Flat package-No leads, or other similar-type electronic substrate. Printed circuit boards (either covered with, or incorporating therein, the polymer composites) may be single sided, double sided, may be incorporated into a stack, or a cable (i.e. a flexible circuit cable). Stacks can include several individual circuits to form what is commonly referred to as a multi-layer board. Any of these types of circuits may be used in a solely flexible or rigid circuit or, or may be combined to form a rigid/flex or flex/rigid printed wiring board or cable.

In the case of a three-layer polymer composite, the spinel crystal filler can be in the outer layers, the inner layer, in at least two-layers, or in all three layers. In addition, the concentration (or loading) of the spinel crystal filler can be different or the same in each individual layer, depending on the final properties desired.

In one embodiment, electromagnetic radiation (i.e., light-energy via a laser beam) is applied to the surface of the polymer composite. In one embodiment, a polymer film or composite can be light activated using a commercially available, Esko-Graphics Cyrel® Digital Imager (CDI). The imager can be operated in a continuous wave mode or can be operated in a pulse mode. The purpose of applying this energy, on a particular predetermined portion of the film, is to light-activate the film surface. As defined herein, the term light-activated is defined as a portion of a surface on a polymer composite, wherein a metal ion can bond to the surface in a manner capable of forming a metal circuit trace. If only a small amount of metal is electroless plated onto the light activated portion of a surface of the film, and is thereby rendered incapable of forming an electrically conductive pathway, the film may not be considered as 'light-activatable' for purposes herein.

A 50-watt Yttrium Aluminum Garnet (YAG) laser may be employed to light activate the polymer composites. However, other types of lasers can be used. In one embodiment, a YAG laser (e.g. Chicago Laser Systems Model CLS-960-S Resistor Trimmer System) can be used to emit energy between 1 and 100 watts, ranging at about 355, 532 or 1064 nm wavelengths light. Generally, the wavelength of the laser light useful to light-activate a portion of the surface of a polymer composite can range from a wavelength between and including any two of the following numbers 200 nm, 355 nm, 532 nm, 1064 nm, or 3000 nm.

Generally, a laser beam can be modulated using an acousto-optic modulator/splitter/attenuator device (AOM) and can produce up to 23 watts in a single beam. The polymer composites can be held in place by vacuum, or by adhesive (or both), on the outer surface of a drum or metal plate. A drum-type assembly can rotate the film at speeds ranging from 1 to 2000 revolutions per minute in order to reduce production time. Spot size (or beam diameter) of the laser beam can be at a focus distance of from between, and including, any two of the following numbers, 1, 2, 4, 6, 8, 10, 15, 20 or 25 microns, typically 18 or 12 microns. Average exposures (e.g. energy dose) can be from between, and including, any two of the following numbers 0.1, 0.5, 1.0, 2, 4, 6, 8, 10, 15 or 20 J/cm$^2$. In the examples, at least 4 and 8 J/cm$^2$ were used.

A digital pattern of a printed circuit board, known as an image file, can be used to direct light to desired portions (i.e., locations) on the surface of a polymer composite. Software may be used to store information regarding the location of lines, spaces, curves, pads, holes, and other information such as pad diameter, pad pitch, and hole diameter. This data may be stored in digital memory that is readily accessible to AOM electronic devices.

The movement of the laser light may be controlled by a computer and is directed in an organized, predetermined, pixel-by-pixel (or line-by-line) manner across a panel or composite surface. The fine features, e.g., less than 100, 75, 50 or 25 microns in line width, of a circuit pattern are inscribed on a surface of the polymer composite. A combination of light sources, scanning, beam modulation, digital pattern transfer, and mechanical conditions stated above, may all be used to provide the desired particular circuit pattern.

In one embodiment, metal is subsequently applied to the light-activated portions of the polymer composites. For these polymer composites, metal can be plated onto a surface using an 'electroless' plating bath in an electroless-plating step. The plating baths may include a copper ion source, a reducing agent, an oxidizing agent, and a chelating agent, in addition to trace amounts of other additives.

Variables that can control the speed and quality in which a plating bath can plate metal onto a surface of a film include, but are not limited to the temperature of the plating bath, the amount of surface to be plated, the chemical balance of the solution (e.g., replenishing the plating solution with a substance that has been consumed), and the degree of mechanical agitation. The temperature range of a plating bath can be controlled at a temperature between room temperature and about 70 to 80° C. The temperature can be adjusted according to the type, and amount, of chelating agent (and other additives) used.

Digitally imaged circuits can be electroless copper plated by using a single-step or two-step process. First, the polymer compositions or composites of the present invention are digitally imaged by a light activation step. Light activation debris, or miscellaneous particles, can be removed by mechanical brushing, air or ultra-sonification in order for a clean electroless copper-plating step to begin. After these initial steps have been taken, the light-activated polymer compositions or composites can be submerged into an electroless copper-plating bath at a plating rate of approximately >3 microns/hour.

The advantages of the present invention are illustrated in the following non-limiting Examples. The processing and test procedures used in the preparation and testing of the composites containing the polymer binders and spinel crystal fillers are described below.

EXAMPLES

The following examples were prepared from a polymer binder blended with a dispersion of the below mentioned spinel crystal filler.

Example 1

A metal oxide slurry was prepared by first, dissolving 25 grams of dispersant Disperbyk-192 (a copolymer with pigment affinic groups made by BYK-Chemie GmbH) in 247.5 grams of acetone in a Netzsch commercially available media mill. The solvent was stirred at 1000 rpms. 250 grams of fine copper chromite spinel, $CuCr_2O_4$ powders (Shepherd Black 20C980) was added and allowed to mix for about 30 minutes. After the above milling process, the mean primary particle size in the slurry was measured to be 0.664 microns. This is slurry is used in the following sample preparations.

Sample A: A 10 weight % filled epoxy composition was prepared by dissolving 7.20 grams of Dyhard™ 100SF (used as hardener, a Cyanoguanidine with anticaking agent from Degussa AG) and 10.80 grams of Dyhard™ UR500 (used as accelerator, a Carbamide compound from Degussa AG) in 162.00 grams of Epon™ 862 (a Bisphenol-F/Epichlorohydrin epoxy resin from Resolution Performance Products, LLP). The composition of Dyhard™ UR500 consists of >80% N,N"-(4-methyl-m-phenylene)bis(N',N'-dimethylurea). After the attainment of a homogeneous and viscous organic medium, 20 grams of the pre-dispersed copper chromite spinel powder slurry was added, and mixed thoroughly by hand or with a commercially available mixer. The above composition was further processed on a three-roll mill to achieve a paste of consistent viscosity and dispersion. The viscosity for this composition was approximately 30-100 Pa·S measured on a Brookfield HBT viscometer using a #5 spindle at 10 rpm and 25° C.

Sample B: A 10 weight % spinel filled epoxy composition was prepared by dissolving 7.12 grams of Dyhard™ 100SF (used as hardener, a Cyanoguanidine with anticaking agent from Degussa AG) and 10.68 grams of Dyhard™ UR500 (used as accelerator, a Carbamide compound from Degussa AG) in 160.2 grams of Epon™ 862 (a Bisphenol-F/Epichlorohydrin epoxy resin from Resolution Performance Products, LLP). The composition of Dyhard™ UR500 consisted of >80% N,N"-(4-methyl-m-phenylene)bis(N',N'-dimethylurea). After the attainment of a homogeneous and viscous organic medium, 20 grams of the pre-dispersed copper chromite spinel powder slurry and 2 grams of soya lecithin (a surfactant from Central Soya Inc.) was added, and mixed thoroughly by hand or a commercially available mixer. The above composition was further processed on a three-roll mill to achieve a paste of consistent viscosity and dispersion. The viscosity for this composition was approximately 30-100 Pa·S measured on a Brookfield HBT viscometer using a #5 spindle at 10 rpm and 25° C.

Sample C: A 10 weight % filled epoxy composition was prepared by using the above ingredients: Dyhard™ 100SF, Dyhard™ UR500, Epon™ 862, and pre-dispersed copper chromite spinel slurry. The surfactant was changed to a phosphate ester (RE-610 from Rhone Poulenc Inc) at the amount of, respectively, 7.12 grams, 10.68 grams, 160.2 grams, 20 grams, and 2 grams.

Sample D: A 10 weight % filled epoxy composition was prepared by using the above ingredients: Dyhard™ 100SF, Dyhard™ UR500, Epon™ 862, and pre-dispersed copper chromite spinel slurry. The surfactant was changed to a defoamer, 2-heptanone (from Eastman Chemicals) in the amount of 7.12 grams, 10.68 grams, 160.2 grams, 20 grams, and 2 grams, respectively.

Sample E: Following the above procedure, a 5 weight % filled composition was prepared by using the above ingredients of Dyhard™ 100SF, Dyhard™ UR500, Epon™ 862, pre-dispersed copper chromite spinel slurry, and soy lecithin in the amounts of 7.52 grams, 11.28 grams, 169.2 grams, 10 grams, and 2 grams, respectively.

Sample F: A 20 weight % filled epoxy composition was prepared by using the above ingredients of Dyhard™ 100SF, Dyhard™ UR500, Epon™ 862, pre-dispersed copper chromite spinel slurry, and soy lecithin in the amounts of 6.32 grams, 9.48 grams, 142.2 grams, 40 grams, and 2 grams, respectively.

Sample G: A 30 weight % filled epoxy composition was prepared by using the above ingredients of Dyhard™ 100SF, Dyhard™ UR500, Epon™ 862, pre-dispersed copper chromite spinel slurry, and soy lecithin in the amounts of 5.52 grams, 8.28 grams, 124.2 grams, 60 grams, and 2 grams, respectively.

The above roll-milled paste compositions were separately coated by a doctor blade on a 5-mil thick Kapton® polyimide carrier film to achieve a uniform thickness in the range of 2.5 to 3.0 mils without pinholes, bubbles, or other visible defects. These thicker sample films were for DC imaging work. A separate set of thinner coating films was also prepared in the range of 0.5 to 2.0 mils with doctor blade for the optical density (OD) measurement whose data are used to calculate the extinction coefficient for this series of $CuCr_2O_4$ spinel filled epoxy samples. After settling for 10 minutes, the coated samples were heated for 1 hour at 150° C. to complete the curing of the epoxy medium.

The data is summarized in TABLE 1 below.

TABLE 1

| Example #1 Sample | Spinel Filled Epoxy | Filler loading (weight-percent) | Film Thickness (microns) | Absorption coefficient (alpha) | Plateability (Y = yes) |
|---|---|---|---|---|---|
| 1A | $CuCr_2O_4$ | 10 | 13.8 | 0.1218 | Y |
| 2A | $CuCr_2O_4$ | 10 | 19 | 0.1357 | Y |
| 3A | $CuCr_2O_4$ | 10 | 144.4 | 0.0616 | Y |
| 4B | $CuCr_2O_4$ | 10 | 10.6 | 0.1694 | Y |
| 5B | $CuCr_2O_4$ | 10 | 45.2 | 0.1167 | Y |
| 6B | $CuCr_2O_4$ | 10 | 47 | 0.1053 | Y |
| 7C | $CuCr_2O_4$ | 10 | 13.8 | 0.1268 | Y |
| 8C | $CuCr_2O_4$ | 10 | 12.4 | 0.143 | Y |
| 9C | $CuCr_2O_4$ | 10 | 41.2 | 0.1269 | Y |
| 10D | $CuCr_2O_4$ | 10 | 55.6 | 0.1015 | Y |
| 11E | $CuCr_2O_4$ | 5 | 14.8 | 0.0731 | Y |
| 12E | $CuCr_2O_4$ | 5 | 32.6 | 0.0509 | Y |
| 13E | $CuCr_2O_4$ | 5 | 46.2 | 0.0493 | Y |
| 14F | $CuCr_2O_4$ | 20 | 15.4 | 0.2153 | Y |
| 13E | $CuCr_2O_4$ | 5 | 46.2 | 0.0493 | Y |
| 14F | $CuCr_2O_4$ | 20 | 15.4 | 0.2153 | Y |
| 15F | $CuCr_2O_4$ | 20 | 43.6 | 0.2039 | Y |
| 16G | $CuCr_2O_4$ | 30 | 21.1 | 0.3416 | Y |
| 17G | $CuCr_2O_4$ | 30 | 12.7 | 0.3699 | Y |
| 18G | $CuCr_2O_4$ | 30 | 16.3 | 0.3221 | Y |

When using a DuPont Cyrel Digital Imager, the laser imageability and copper plateability are summarized below for Samples A-G at any thickness.

| Samples | Energy Dosage (J/cm$^2$) | | | | |
|---|---|---|---|---|---|
| | 2 | 4 | 6 | 8 | 10 |
| A | faint | good | good | good | good |
| B | faint | good | good | good | good |
| C | no | faint | good | good | good |
| D | faint | good | good | good | good |
| E | faint | good | good | good | good |
| F | good | good | good | good | good |
| G | good | good | good | good | good |

It is to be understood that although the above examples employ one type of epoxy resin, the example is exemplary only. The epoxy resin used represents a vast family of various epoxy resins.

Example 2

A metal oxide slurry was prepared by dissolving 25 grams of dispersant Disperbyk-192 (a copolymer with pigment affinic groups made by BYK-Chemie GmbH) in 247.5 grams of acetone in a Netzsch commercially available media mill. The solvent was stirred at 1000 rpms. 250 grams of fine copper chromite spinel, $CuCr_2O_4$ powders (Shepherd Black 20C980) was added and allowed to mix for about 30 minutes. After the above milling process, the mean primary particle size in the slurry was measured to be 0.664 microns. This slurry is the slurry used in the following sample preparations.

Bismaleimide/triazine (BT) resins are reaction products of Bismaleimide and dicyanobisphenol A leading to structures containing triazine and diazine rings. These are sold as BT resins by Mitsubishi Chemical and are classified as a cyanate ester. BT has a Tg of about 195° C. and can provide an operating temperature of about 160° C. The BT resin solution acquired for this DC study is consisted of 70 weight % resin and 30 weight % Methyl Ethyl Ketone (MEK) as solvent.

In order to raise the viscosity of the BT resin solution, MEK was evaporated in a fume hood with magnetic stirring at room temperature. The choice of room temperature evaporation was to assure no undesirable thermal effect to change the physical and chemical nature of the BT resin in the as-received solution. A 20.5 hour evaporation removed 7.03 weight % MEK to provide a 75.29 weight % BT resin solution. This process was found to increase the viscosity of BT resin solution to obtain a filled BT of adequate viscosity for more acceptable coating for digital circuitry imaging.

Three compositions, H, I, and J, were made to provide 5, 10, and 20 weight % $CuCr_2O_4$ spinel in BT resin. The actual amounts were calculated with the needed BT resin quantity after deducting the volatile MEK solvent which should be nearly completely removed after the subsequent step of solvent drying at 80° C. $CuCr_2O_4$ spinel powders were easily dispersed in the BT resin solution and suitable methods for mixing inorganic materials with organic binder solutions were used. Due to the high volatility of the solvent MEK used in the BT resin solution, however, the dispersion apparatus/method should provide full or semi-enclosure of the treated materials to minimize the loss of MEK which will raise the overall viscosity and/or form surface skin. Specific sample preparation procedures are described below.

Sample H: 50 grams of 5 weight % $CuCr_2O_4$ spinel in BT resin composition was prepared by mixing 2.50 grams of the above $CuCr_2O_4$ spinel powder slurry in 63.09 grams of the previously concentrated BT resin solution (with 75.29 weight % BT resin in MEK). Although the total amount of the added ingredients was 65.59 grams, after discounting the volatile MEK solvent, the remaining $CuCr_2O_4$ spinel and BT resin yielded the specified quantity of 50 grams.

Sample I: 50 grams of 10 weight % $CuCr_2O_4$ spinel in BT resin composition was prepared by mixing 5.00 grams of the above $CuCr_2O_4$ spinel powder slurry in 59.77 grams of the previously concentrated BT resin solution (with 75.29 weight % BT resin in MEK). Although the total amount of the added ingredients was 64.77 grams, after discounting the volatile MEK solvent, the remaining $CuCr_2O_4$ spinel and BT resin yielded the specified quantity of 50 grams.

Sample J: 50 grams of 20 weight % $CuCr_2O_4$ spinel in BT resin composition was prepared by mixing 10.00 grams of the above $CuCr_2O_4$ spinel powder slurry in 53.13 grams of the previously concentrated BT resin solution (with 75.29 weight % BT resin in MEK). Although the total amount of the added ingredients was 63.13 grams, after discounting the volatile MEK solvent, the remaining $CuCr_2O_4$ spinel slurry and BT resin yielded the specified quantity of 50 grams.

A parallel group of three compositions, K, L and M, were also prepared to provide 5, 20, and 30 weight % $CuCr_2O_4$ spinel in BT resin with the addition of 1 weight % soya lecithin as a surfactant. The actual amounts were calculated with the needed BT resin quantity after deducting the volatile MEK solvent which should be nearly completely removed after the subsequent step of solvent drying at 80 degrees C. To maintain the desired weight % of $CuCr_2O_4$ spinel, the soya lecithin surfactant was added at the expense of the BT resin. Specific sample preparation procedures are described below.

Sample K: 50 grams of 5 weight % $CuCr_2O_4$ spinel in BT resin composition was prepared by mixing 2.50 grams of the above $CuCr_2O_4$ spinel powder slurry in 62.42 grams of the previously concentrated BT resin solution (with 75.29 weight % BT resin in MEK) and 0.5 grams of soya lecithin as surfactant. Although the total amount of the added ingredients was 65.42 grams, after discounting the volatile MEK solvent, the remaining $CuCr_2O_4$ spinel and BT resin yielded the specified quantity of 50 grams.

Sample L: 50 grams of 20 weight % $CuCr_2O_4$ spinel in BT resin composition was prepared by mixing 10.00 grams of the above $CuCr_2O_4$ spinel powder slurry in 52.46 grams of the previously concentrated BT resin solution (with 75.29 weight % BT resin in MEK) and 0.5 grams of soya lecithin as surfactant. Although the total amount of the added ingredients was 62.96 grams, after discounting the volatile MEK solvent, the remaining $CuCr_2O_4$ spinel and BT resin yield the specified quantity of 50 grams.

Sample M: 50 grams of 30 weight % $CuCr_2O_4$ spinel in BT resin composition was prepared by mixing 15.00 grams of the above $CuCr_2O_4$ spinel powder slurry in 45.82 grams of the previously concentrated BT resin solution (with 75.29 weight % BT resin in MEK) and 0.5 grams of soya lecithin as surfactant. Although the total amount of the added ingredients was 61.32 grams, after discounting the volatile MEK solvent, the remaining $CuCr_2O_4$ spinel and BT resin yield the specified quantity of 50 grams.

For DC imaging work, a one millimeter thick copper foil was used as a carrier layer. The above H to M compositions were separately coated by a doctor blade to achieve a uniform thickness in the range of 2.5 to 3.0 mils without pinholes, bubbles, or other visible defects. After settling for 10 minutes, the coated samples were heated for 1 hour at 80° C. to evaporate the MEK solvent contained in the BT resin solution, followed by a 90 minute curing at 200° C. of the BT resin as recommended by the manufacturer.

A separate set of thinner coating films were also prepared in the range of 0.5 to 2.0 mils on a 5-mil thick Kapton® polyimide carrier film with doctor blade for the optical density (OD) measurement whose data are used to calculate the extinction coefficient for this series of $CuCr_2O_4$ spinel filled BT samples.

The data for the spinel-filled BT resin is summarized in Table 2 below.

TABLE 2

| Example #2 Sample | Spinel Filled BT resin | Filler loading (weight-percent) | Film Thickness (microns) | Absorption coefficient (alpha) | Plateability (Y = yes, N = no) |
|---|---|---|---|---|---|
| 19H | CuCr$_2$O$_4$ | 5 | 28.2 | 0.0282 | N |
| 20I | CuCr$_2$O$_4$ | 10 | 21.4 | 0.0533 | Y |
| 21J | CuCr$_2$O$_4$ | 20 | 20 | 0.082 | Y |
| 22K | CuCr$_2$O$_4$ | 5 | 27.4 | 0.0295 | N |
| 23L | CuCr$_2$O$_4$ | 20 | 24.4 | 0.0904 | Y |
| 24M | CuCr$_2$O$_4$ | 30 | 25.3 | 0.1233 | Y |
| 25M | CuCr$_2$O$_4$ | 30 | 27.8 | 0.1224 | Y |

For Table 1 and Table 2, assuming no light scattering, $I_x = I_o * e^{(-\alpha^* x)}$; $T = I_x/I_o = 10^{(-OD)} = e^{(-\alpha^* x)}$; $a = -[LN(10(-OD))]/x$; and $OD = -LOG(T)$.

When using a DuPont Cyrel Digital Imager, the laser imageability and copper plateability are summarized below for Samples I, J, L, and M (Workable examples) and H, and K (Comparative examples).

Workable Examples

| | Energy Dosage (J/cm$^2$) | | | | | |
|---|---|---|---|---|---|---|
| Sample | 4 | 6 | 8 | 10 | 15 | 20 |
| I | faint | faint | good | good | fair | fair |
| J | fair | fair | good | good | good | good |
| L | fair | good | good | good | good | fair |
| M | fair | good | good | good | good | good |

Comparative Examples

| | Energy Dosage (J/cm$^2$) | | | | | |
|---|---|---|---|---|---|---|
| Sample | 4 | 6 | 8 | 10 | 15 | 20 |
| H | no | no | no | no | no | no |
| K | no | no | no | no | no | no |

The polymer composites formed may be used to make circuits having fine electrically conductive pathways. The fine electrically conductive pathways may be formed using an electro-less metal plating step. After light-activating the surface of the composite with a laser beam, for example, the light activated portions are plated to form thin lines, or pathways, on the surface of the polymer compositions or composites.

Without wishing to be held to any particular theory of the present invention, at least in some embodiments of the present invention, it is believed that the amplified light (e.g., laser) substantially, if not completely, volatilizes away the polymeric continuous domain, leaving exposed the discontinuous spinel crystal type domains. The heat treatment and sudden exposure to ambient conditions (of the spinel crystals) caused by the amplified light, appears to prepare the crystals to receive metallization processing.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. For example, advantages include the formation of fine line features, the simplification of the manufacturing process of making circuits on boards as compared to a lithographic process of forming copper patterns on substrates, the ability to process reel-to-reel at the laser imaging step, in addition to the plating step, as opposed to a panel-to-panel batch processing method. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A laser light-activatable, platable, self supporting composite film comprising:
    A. a polymer binder selected from a group consisting of: epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, and combinations thereof, the polymer binder being present in an amount from 50 to 97 weight-percent of the total weight of the composite film; and
    B. a spinel crystal filler present in an amount from 3 to 50 weight-percent of the total weight of the polymer composite film; and
    C. wherein the polymer composite has a 400 nm to 1,000,000 nm light extinction coefficient from 0.05 to 0.6 per micron, wherein the spinel crystal filler is represented by a chemical formula AB$_2$O$_4$ or BABO$_4$, where A is a metal cation having a valence of 2 selected from a group consisting of cadmium, zinc, copper, cobalt, magnesium, tin, titanium, iron, aluminum, nickel, manganese, chromium, and combinations of two or more of these, and where B is a metal cation having a valence of 3 selected from a group consisting of cadmium, manganese, nickel, copper, cobalt, iron, tin, titanium, aluminum, chromium, and combinations of two or more of these,
wherein the film is a self-supporting film.

2. The laser light-activatable, platable, self supporting composite film in accordance with claim 1 wherein A is an element from the periodic table selected from the group consisting of cadmium, chromium, manganese, nickel, zinc, copper, cobalt, iron, magnesium, tin, titanium, and combinations of two or more of these.

3. The laser light-activatable, platable, self supporting composite film in accordance with claim 1 wherein B is an element from the periodic table selected from the group consisting of chromium, iron, aluminum, nickel, manganese, tin, and combinations of two or more of these.

4. The laser light-activatable, platable, self supporting composite film in accordance with claim 1 wherein the spinel crystal filler has an average particle size from 50 to 100 nanometers.

5. The laser light-activatable, platable, self supporting composite film in accordance with claim 1, wherein the composition is impregnated into a glass structure to form a prepreg.

6. The laser light-activatable, platable, self supporting composite film in accordance with claim 1, wherein the composition is impregnated into a fiber structure.

7. The laser light-activatable, platable, self supporting composite film in accordance with claim 1, wherein the film has a thickness from 1 to 200 microns.

8. The laser light-activatable, platable, self supporting composite film in accordance with claim 1, wherein the polymer binder is an epoxy resin.

9. The laser light-activatable, platable, self supporting composite film in accordance with claim 1, wherein the polymer binder is bismaleimide triazine or bismaleimide resin.

10. The laser light-activatable, platable, self supporting composite film in accordance with claim 1, wherein the polymer binder is a fluoropolymer.

11. The laser light-activatable, platable, self supporting composite film in accordance with claim 1, wherein the polymer binder is a polyester.

12. The laser light-activatable, platable, self supporting composite film in accordance with claim 1, wherein the polymer binder is a liquid crystal polymer.

13. The laser light-activatable, platable, self supporting composite film in accordance with claim 1, wherein the polymer binder is a polyamide.

14. The laser light-activatable, platable, self supporting composite film in accordance with claim 1, wherein the polymer binder is a cyanate ester.

15. The laser light-activatable, platable, self supporting composite film in accordance with claim 1, further comprising a metal layer wherein the metal layer is adjacent to the composite film.

16. A circuit board incorporating the laser light-activatable, platable, self supporting composite film of claim 1.

17. The laser light-activatable, platable, self supporting composite film of claim 1, incorporated into a component selected from an integrated circuit package, an interconnect in a pin grid array, a multi-chip module, a chip-scale package, a ball grid array, a radio frequency module, a digital module, chip-on-flex, a stacked via substrate, a printed circuit board having embedded passive devices, a high density interconnect circuit board, an "LGA" Land grid array, an "SOP" (System-on Package) Module, a "QFN" Quad Flat package-No Leads, and a "FC-QFN" Flip Chip Quad Flat package-No leads, a component used in a high density interconnect, including a wafer scale package, a tape automated bonding circuit package, a chip-on-flex circuit package, or a chip-on-board electronic circuit package.

18. The laser light-activatable, platable, self supporting composite film of claim 1, further comprising an additive selected from the group consisting of an antioxidant, a light stabilizer, a light extinction coefficient modifier, a flame retardant additive, an anti-static agent, a heat stabilizer, a reinforcing agent, an ultraviolet light absorbing agent, an inorganic filler, a surfactant, dispersing agent, and a combination thereof.

19. The laser light-activatable, platable, self supporting composite film of claim 18, wherein the inorganic filler is selected from the group consisting of silica and alumina.

20. The laser light-activatable, platable, self supporting composite film of claim 18, wherein the light extinction coefficient modifier is a carbon powder or graphite powder.

21. A laminate comprising the laser light-activatable, platable, self supporting composite film of claim 1 and a metal layer wherein the metal layer is deposited onto the composite film by either an electroless plating or electrolytic plating method.

22. A two-layer laser light-activatable, platable, self supporting composite film—having a top layer and a bottom layer, the top layer consisting essentially of:
A. a polymer binder selected from a group consisting of: epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, and combinations thereof, the polymer binder being present in an amount from 50 to 97 weight-percent of the total weight of the top layer; and
B. a spinel crystal filler present in an amount from 3 to 50 weight-percent based on the total weight of the top layer, and
C. wherein the composite film has a 400 nm to 1,000,000 nm light extinction coefficient from 0.05 to 0.6 per micron wherein the spinel crystal filler is represented by a chemical formula $AB_2O_4$ or $BABO_4$, where A is a metal cation having a valence of 2 selected from a group consisting of cadmium, zinc, copper, cobalt, magnesium, tin, titanium, iron, aluminum, nickel, manganese, chromium, and combinations of two or more of these, and where B is a metal cation having a valence of 3 selected from a group consisting of cadmium, manganese, nickel, copper, cobalt, iron, tin, titanium, aluminum, chromium, and combinations of two or more of these, and wherein the bottom layer comprises a functional layer.

23. The two-layer laser light-activatable, platable, self supporting composite film of claim 22, wherein the top layer is in the form of a prepreg.

24. The two-layer laser light-activatable, platable, self supporting composite film of claim 22, wherein the bottom layer is a thermal conduction layer.

25. The two-layer laser light-activatable, platable, self supporting composite film of claim 22, wherein the bottom layer is a capacitor layer.

26. The two-layer laser light-activatable, platable, self supporting composite film of claim 22, wherein the bottom layer is a resistor layer.

27. The two-layer laser light-activatable, platable, self supporting composite film of claim 22, wherein the bottom layer is a dimensionally stable dielectric layer.

28. The two-layer laser light-activatable, platable, self supporting composite film of claim 22, wherein the bottom layer is an adhesive layer.

29. The two-layer laser light-activatable, platable, self supporting composite film of claim 22, wherein the bottom layer is in the form of a film.

30. The two-layer laser light-activatable, platable, self supporting composite film of claim 22, wherein the bottom layer is in the form of a prepreg.

31. A three-layer laser light-activatable, platable, self supporting composite film comprising two outer layers adjacent to an inner layer; the inner layer positioned between the two outer layers,
wherein at least one of the outer layers comprises:
A. a polymer binder selected from a group consisting of: epoxy resins, silica filled epoxy, bismaleimide resins, bismaleimide triazines, fluoropolymers, polyesters, polyphenylene oxide/polyphenylene ether resins, polybutadiene/polyisoprene crosslinkable resins (and copolymers), liquid crystal polymers, polyamides, cyanate esters, and combinations thereof, the polymer binder being present in an amount from 50 to 97 weight-percent of the total weight of the outer layer; and B. a spinel crystal filler present in an amount from 3 to 50 weight-percent based on the total weight of the outer layer, and C. wherein the composite film has a 400 nm to 1,000,000 nm light extinction coefficient of 0.05 to 0.6 per micron, wherein the spinel crystal filler is represented by a chemical formula $AB_2O_4$ or $BABO_4$, where A is a metal cation having a valence of 2 selected from a group consisting of cadmium, zinc, copper, cobalt, magnesium, tin, titanium, iron, aluminum, nickel, manganese, chromium, and combinations of two or more of these, and where B is a metal cation having a valence of 3 selected from a group consisting of cadmium, manganese, nickel, copper, cobalt, iron, tin, titanium, aluminum, chromium, and combinations of two or more of these; and wherein the inner layer comprises a functional layer.

32. The three-layer laser light-activatable, platable, self supporting composite film of claim 31, wherein at least one of the outer layers is in the form of a prepreg.

* * * * *